US012568669B2

(12) United States Patent
Xie et al.

(10) Patent No.: US 12,568,669 B2
(45) Date of Patent: Mar. 3, 2026

(54) PLACEHOLDER PROFILE FORMATION FOR BACKSIDE CONTACT

(71) Applicant: INTERNATIONAL BUSINESS MACHINES CORPORATION, Armonk, NY (US)

(72) Inventors: Ruilong Xie, Niskayuna, NY (US); Jay William Strane, Wappingers Falls, NY (US); Junli Wang, Slingerlands, NY (US); Albert M. Chu, Nashua, NH (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 18/314,173

(22) Filed: May 9, 2023

(65) Prior Publication Data

US 2024/0379769 A1    Nov. 14, 2024

(51) Int. Cl.
| | |
|---|---|
| H10D 64/01 | (2025.01) |
| H10D 30/01 | (2025.01) |
| H10D 30/43 | (2025.01) |
| H10D 30/67 | (2025.01) |
| H10D 62/10 | (2025.01) |

(52) U.S. Cl.
CPC ........... H10D 64/01 (2025.01); H10D 30/014 (2025.01); H10D 30/031 (2025.01); H10D 30/43 (2025.01); H10D 30/6729 (2025.01); H10D 30/6735 (2025.01); H10D 62/121 (2025.01)

(58) Field of Classification Search
CPC .... H10D 64/01; H10D 30/014; H10D 30/031; H10D 30/43; H10D 30/6729; H10D 30/6735; H10D 62/121; H10D 62/151; H10D 62/822
See application file for complete search history.

(56) References Cited

U.S. PATENT DOCUMENTS

| | | | |
|---|---|---|---|
| 9,466,723 | B1 | 10/2016 | Huang |
| 9,620,590 | B1 | 4/2017 | Bergendahl |
| 10,892,337 | B2 | 1/2021 | Glass |
| 11,233,005 | B1 | 1/2022 | Chen |
| 11,264,481 | B2 | 3/2022 | Park |
| 2020/0303509 | A1 | 9/2020 | Mehandru |
| 2021/0111115 | A1 | 4/2021 | Morrow |
| 2021/0134721 | A1 | 5/2021 | Chiang |
| 2021/0202385 | A1 | 7/2021 | Huang |
| 2021/0305252 | A1 | 9/2021 | Chiang |

(Continued)

*Primary Examiner* — Mohammad A Rahman
(74) *Attorney, Agent, or Firm* — Yuanmin Cai

(57)    ABSTRACT

Embodiments of present invention provide a method of forming backside contact. The method includes forming a set of gate stacks on top of a substrate; forming a first recess in the substrate between the set of gate stacks, the first recess having a triangle shape with a pointy bottom; forming a dielectric anchor at the pointy bottom of the first recess; with the dielectric anchor at the pointy bottom, performing a sigma etch of the substrate through the first recess to form a second recess; epitaxially growing a semiconductor material in the second recess to form a placeholder for a backside contact; surrounding the placeholder with a dielectric material; and replacing the placeholder with a conductive material to form the backside contact. The semiconductor structure formed thereby is also provided.

14 Claims, 22 Drawing Sheets

(56)                     References Cited

U.S. PATENT DOCUMENTS

| | | |
|---|---|---|
| 2021/0305381 A1 | 9/2021 | Chiang |
| 2021/0351303 A1 | 11/2021 | Ju |
| 2021/0376071 A1 | 12/2021 | Liu |
| 2021/0376093 A1 | 12/2021 | Chu |
| 2022/0139911 A1 | 5/2022 | Wei |
| 2022/0181339 A1* | 6/2022 | Wu ..................... H10D 64/035 |
| 2022/0352339 A1 | 11/2022 | Wang |

* cited by examiner

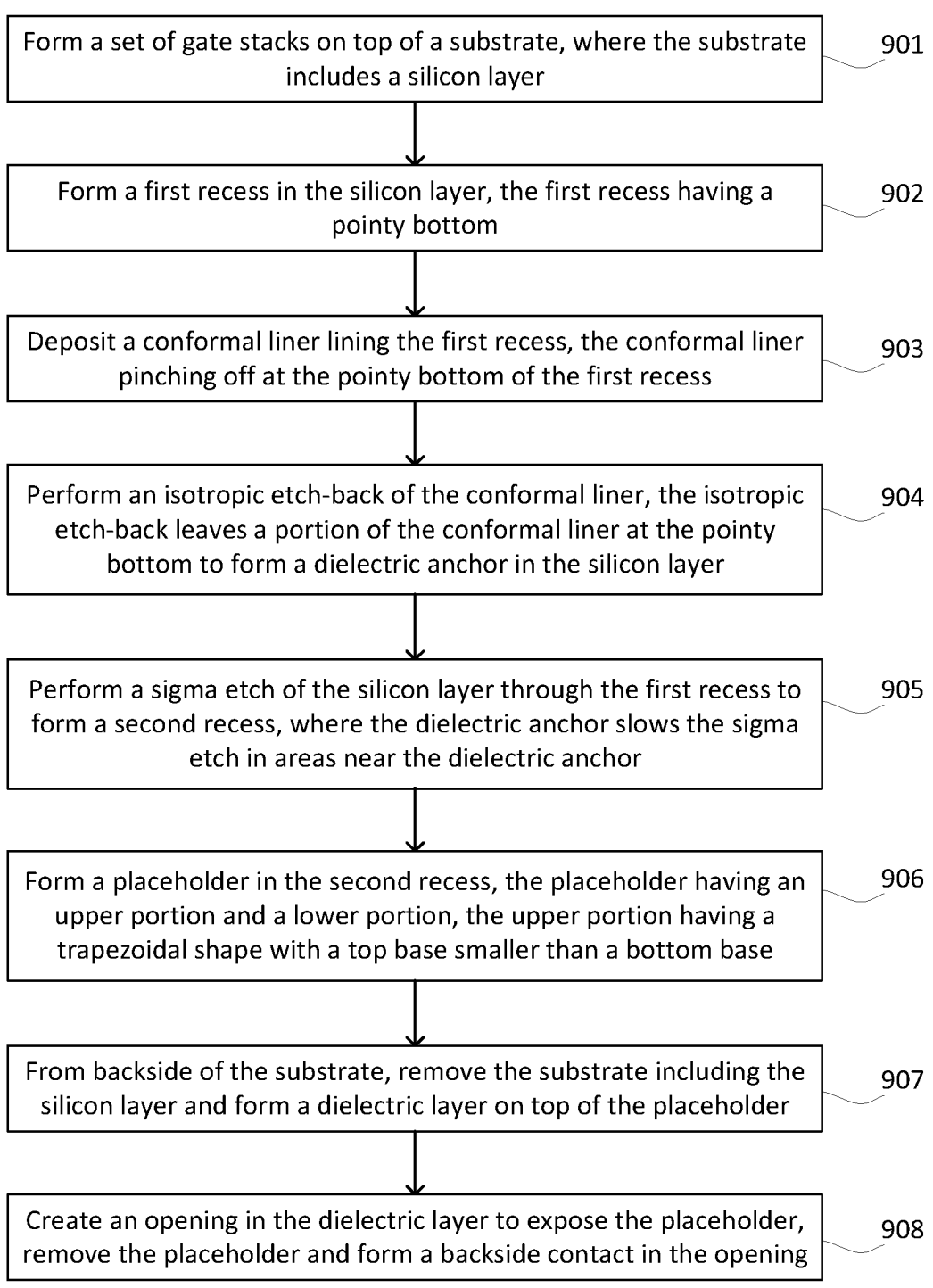

Form a set of gate stacks on top of a substrate, where the substrate includes a silicon layer — 901

Form a first recess in the silicon layer, the first recess having a pointy bottom — 902

Deposit a conformal liner lining the first recess, the conformal liner pinching off at the pointy bottom of the first recess — 903

Perform an isotropic etch-back of the conformal liner, the isotropic etch-back leaves a portion of the conformal liner at the pointy bottom to form a dielectric anchor in the silicon layer — 904

Perform a sigma etch of the silicon layer through the first recess to form a second recess, where the dielectric anchor slows the sigma etch in areas near the dielectric anchor — 905

Form a placeholder in the second recess, the placeholder having an upper portion and a lower portion, the upper portion having a trapezoidal shape with a top base smaller than a bottom base — 906

From backside of the substrate, remove the substrate including the silicon layer and form a dielectric layer on top of the placeholder — 907

Create an opening in the dielectric layer to expose the placeholder, remove the placeholder and form a backside contact in the opening — 908

FIG. 22

PLACEHOLDER PROFILE FORMATION FOR BACKSIDE CONTACT

BACKGROUND

The present application relates to manufacturing of semiconductor integrated circuits. More particularly, it relates to a method of forming placeholder profile for forming backside contact and the structure formed thereby.

A semiconductor device and/or structure typically includes front-end-of-line (FEOL) devices such as transistors, middle-of-line (MOL) contacts such as contacts to transistors, and back-end-of-line (BEOL) structures such as interconnect structures. Recent advancement in semiconductor device manufacturing has led to the introduction of backside contact and backside interconnect at the backside of the FEOL devices. Backside contact and backside interconnect are normally formed from the backside of the FEOL devices, by removing most of the substrate upon which the FEOL devices are formed, after the chip or wafer under manufacturing is flipped upside-down.

To assist the formation of backside contacts to the FEOL devices, contact placeholders are formed generally during a frontside processing step. These contact placeholders are then replaced with actual backside contacts during a backside processing step. In the current art, contact placeholders typically have a trapezoidal shape with a bottom base of the trapezoidal shape being narrower than a top base of the trapezoidal shape, which is not desirable for forming backside contacts due to the narrow opening during the backside processing step. On the other hand, even though contact placeholders formed through a sigma etch process may have a profile with a portion of which having a bottom that is wider than a top, the height of that portion of the profile is usually very small, which may not be sufficient for forming the backside contacts during the backside processing step. Moreover, a deep recess may be necessary in order to reach that portion of the profile and, since that portion of the profile usually has a small height, there is little error of margin left when performing the deep recess.

SUMMARY

Embodiments of present invention provide a method of forming backside contact. The method includes creating a first recess in a substrate, the first recess having a pointy bottom; forming a dielectric anchor at the pointy bottom of the first recess; performing a sigma etch of the substrate via the first recess while keeping the dielectric anchor at the pointy bottom of the first recess, thereby transforming the first recess into a second recess; and filling the second recess with a semiconductor material to form a placeholder.

In one embodiment, forming the dielectric anchor includes depositing a conformal liner lining the first recess, where a portion of the conformal liner pinches off at the pointy bottom of the first recess; and performing an isotropic etch-back of the conformal liner, where the isotropic etch-back leaves the portion of the conformal liner that pinches off at the pointy bottom of the first recess substantially unetched to form the dielectric anchor while removing portions of the conformal liner above the dielectric anchor from the first recess.

In another embodiment, the second recess has a first set of facets adjacent to a top surface of the substrate and a second set of facets adjacent to the dielectric anchor, wherein the first and the second set of facets, when being measured vertically, has a first height and a second height respectively, and the first height of the first set of facets is greater than the second height of the second set of facets. In one aspect, the dielectric anchor at the pointy bottom of the first recess causes the sigma etch to slow down in areas near the dielectric anchor thereby causing the creation of the first and the second set of facets.

In one embodiment, the first recess has a triangle shape with the pointy bottom.

In another embodiment, performing the sigma etch does not cause the dielectric anchor to be removed from the first recess, and causes the dielectric anchor to remain at a bottom of the second recess.

In one embodiment, the placeholder includes silicon-germanium (SiGe) and the method further includes replacing the placeholder with a conductive material to form a backside contact. In one aspect, before replacing the placeholder, the method further includes replacing the substrate with a dielectric layer and causing the placeholder to be embedded in the dielectric layer.

In another embodiment, the first recess is formed horizontally between a first gate stack and a second gate stack and in the substrate, wherein the first and the second gate stack are formed on top of the substrate.

Embodiments of present invention also provide a semiconductor structure. The semiconductor structure includes a placeholder embedded in a dielectric layer; and a dielectric anchor at a pointy bottom of the placeholder, where the placeholder includes at least a first set of facets adjacent to a top surface of the substrate and a second set of facets adjacent to the dielectric anchor, and the first and the second set of facets, when being measured vertically, have a first height and a second height respectively, where the first height of the first set of facets is greater than the second height of the second set of facets.

In one embodiment, the structure further includes a backside contact adjacent to the placeholder and embedded in the dielectric layer, the backside contact contacting a source/drain region of a transistor formed above the dielectric layer.

In another embodiment, at least an upper portion of the backside contact, near the source/drain region of the transistor, has a shape that is similar to a shape of an upper portion of the placeholder.

In one embodiment, the upper portion of the backside contact has a trapezoidal shape with a top base of the trapezoidal shape being smaller than a bottom base of the trapezoidal shape.

In another embodiment, the placeholder includes silicon-germanium (SiGe) and the dielectric anchor includes silicon-nitride (SiN).

In yet another embodiment, the source/drain region is a first source/drain region of the transistor, and the semiconductor structure further includes a second source/drain region of the transistor directly above the placeholder, and a gate stack between the first and the second source/drain region.

BRIEF DESCRIPTION OF THE DRAWINGS

The present invention will be understood and appreciated more fully from the following detailed description of embodiments of present invention, taken in conjunction with accompanying drawings of which:

FIG. 22 is a demonstrative illustration of a flow-chart of a method of manufacturing a semiconductor structure according to embodiments of present invention.

Figure 1:
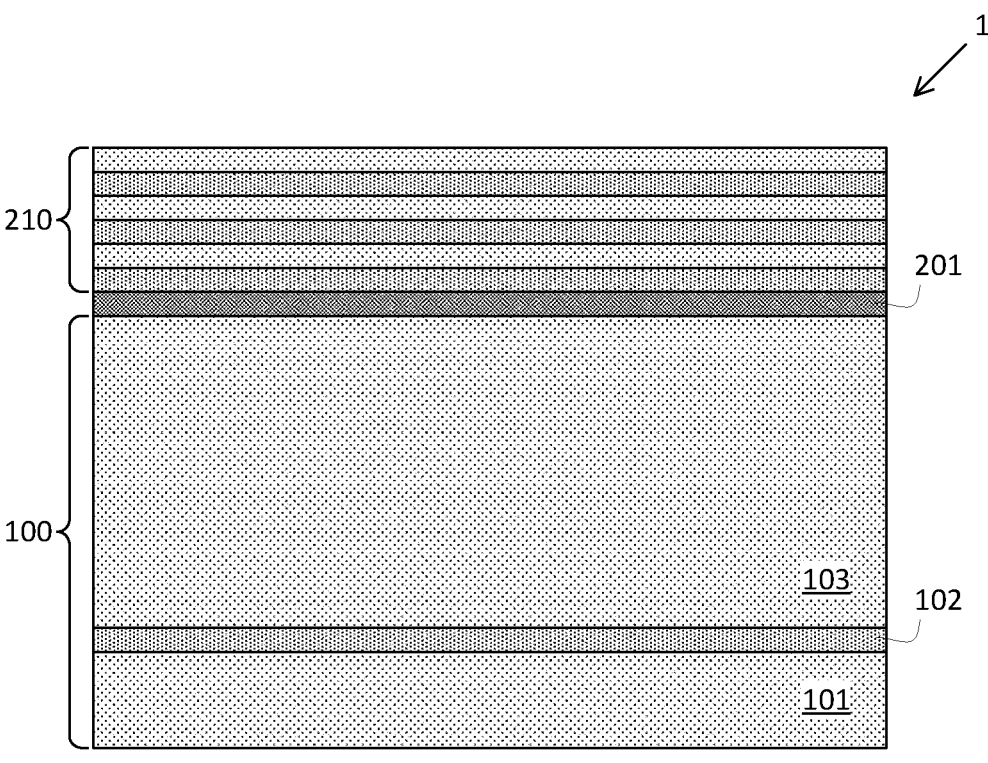
FIGS. 1-21 are demonstrative illustrations of cross-sectional views of a semiconductor structure in various steps of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure in a step of manufacturing thereof according to one embodiment of present invention. More particularly, embodiments of present invention provide forming a semiconductor structure 10 by receiving or preparing a semiconductor substrate 100. The semiconductor substrate 100 may include a silicon (Si) layer 103 on top of a silicon-germanium (SiGe) layer 102, which in-turn may be on top of a Si substrate 101. The SiGe layer 102 may have a germanium (Ge) concentration level of around 30% and thus may be referred to as a SiGe30 layer 102.

Embodiments of present invention further provide proceeding to form one or more transistor structures on top of the semiconductor substrate 100. As a non-limiting example, and for the sole purpose of illustration and description of embodiments of present invention, hereinafter it is assumed that one or more nanosheet transistors are to be formed on top of the semiconductor substrate 100, although other types of transistors such as, for example, fin-type transistors and/or vertical transistors may be formed as well.

In order to form one or more nanosheet transistors, embodiments of present invention provide forming a SiGe55 layer 201, that is, a SiGe layer having a Ge concentration level of around 55%, on top of the Si layer 103. Subsequently, a stack of nanosheets 210 may be formed on top of the SiGe55 layer 201. The stack of nanosheets 210 may include a set of Si nanosheets separated by a set of SiGe30 layers.

Figure 2:
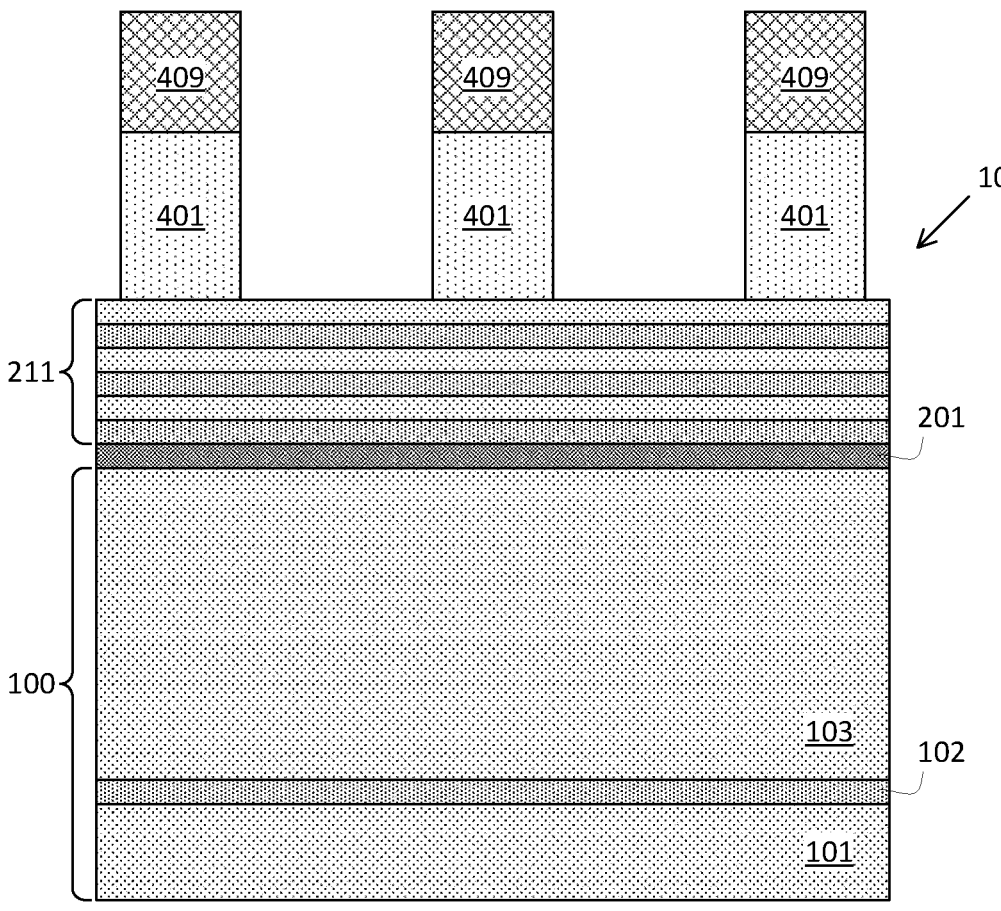

FIG. 2 is a demonstrative illustration of cross-sectional view of a semiconductor structure in a step of manufacturing thereof according to one embodiment of present invention. More particularly, following the step illustrated in FIG. 1, embodiments of present invention provide patterning the stack of nanosheets 210 into multiple stacks of nanosheets 211 and forming shallow trench isolations (not shown) in the substrate 100 that separate the multiple stacks of nanosheets 211. Next, embodiments of present invention provide forming a set of dummy gates 401 on top of the stacks of nanosheets 211. The set of dummy gates 401 may be formed through patterning a set of hard masks 409 on top of a layer of dummy gate material and subsequently transferring the pattern of the set of hard masks 409 onto the layer of dummy gate material underneath thereof to form the set of dummy gates 401. In one embodiment, the layer of dummy gate material may be, for example, a polysilicon (Si) layer over a thin silicon-oxide ($SiO_2$) layer. However, embodiments of present invention are not limited in this aspect and other types of dummy gate material may be used as well.

Figure 3:
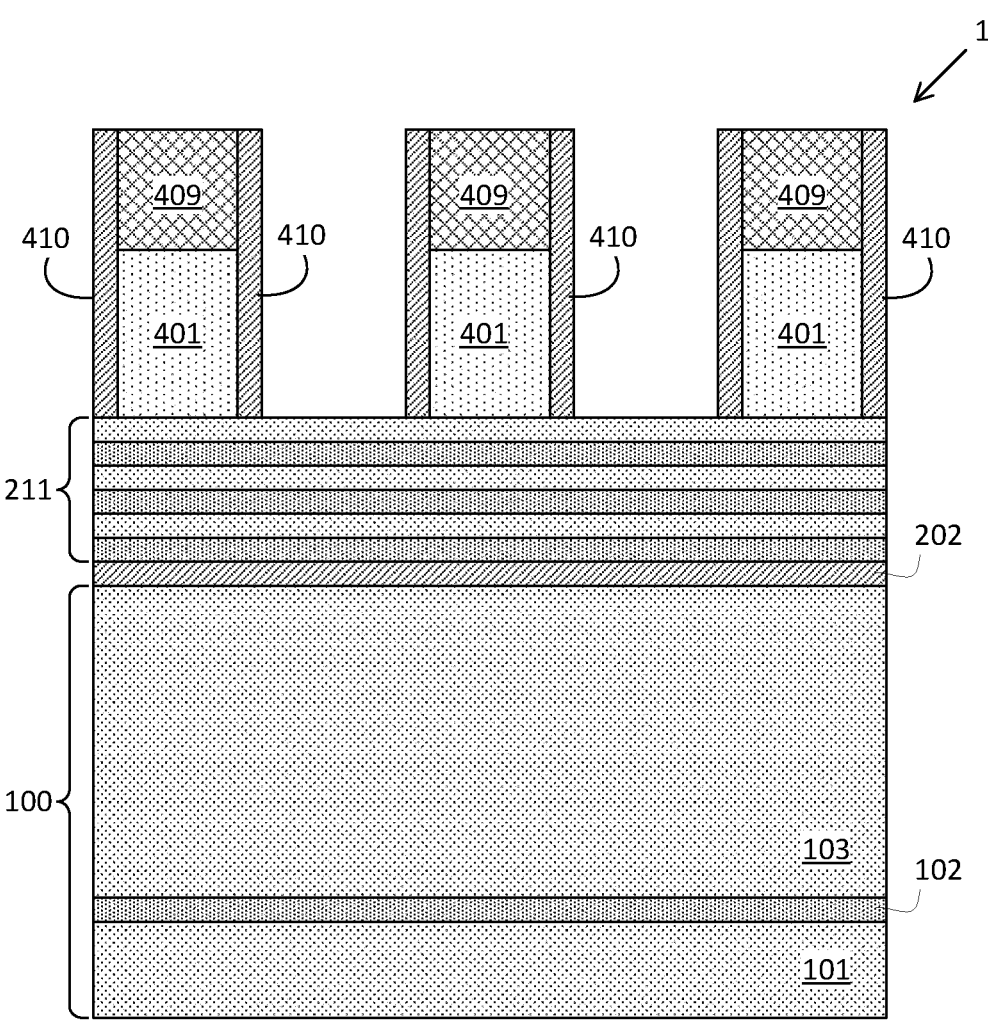

FIG. 3 is a demonstrative illustration of cross-sectional view of a semiconductor structure in a step of manufacturing thereof according to one embodiment of present invention. More particularly, following the step illustrated in FIG. 2, embodiments of present invention provide replacing the SiGe55 layer 201 with a dielectric layer 202 by first selectively removing the SiGe55 layer 201 and then forming the dielectric layer 202 in areas where the SiGe55 layer 201 is removed through a deposition process. The SiGe55 layer 201 may be selectively removed by utilizing different etch selectivity among SiGe layers of different Ge concentrations. For example, a SiGe55 layer may have an etch selectivity different from a SiGe30 layer or a Si layer. Therefore, the SiGe55 layer 201 may be selectively removed without impacting the SiGe30 layers or the Si nanosheets in the stack of nanosheets 211.

Embodiments of present invention further provide forming a set of sidewall spacers 410 at sidewalls of the set of dummy gates 401. The set of sidewall spacers 410 may be formed together with the process of forming the dielectric layer 202. The set of sidewall spacers 410 and the dielectric layer 202 may be made of dielectric material such as, for example, silicon-nitride (SiN), silicon-oxycarbonitride (SiOCN), silicoboron-carbonitride (SiBCN), silicon-oxycarbide (SiOC), etc. The set of sidewall spacers 410 may be formed, for example, through first forming a conformal dielectric layer covering the set of dummy gates 401, the hard masks 409 on top thereof, and the exposed portions of the stacks of nanosheets 211 between the set of dummy gates 401. Next, a directional and/or selective etching process may be applied to remove horizontal portions of the conformal dielectric layer, which leaves only vertical portions of the conformal dielectric layer at sidewalls of the set of dummy gates 401 to form the set of sidewall spacers 410.

Figure 4:
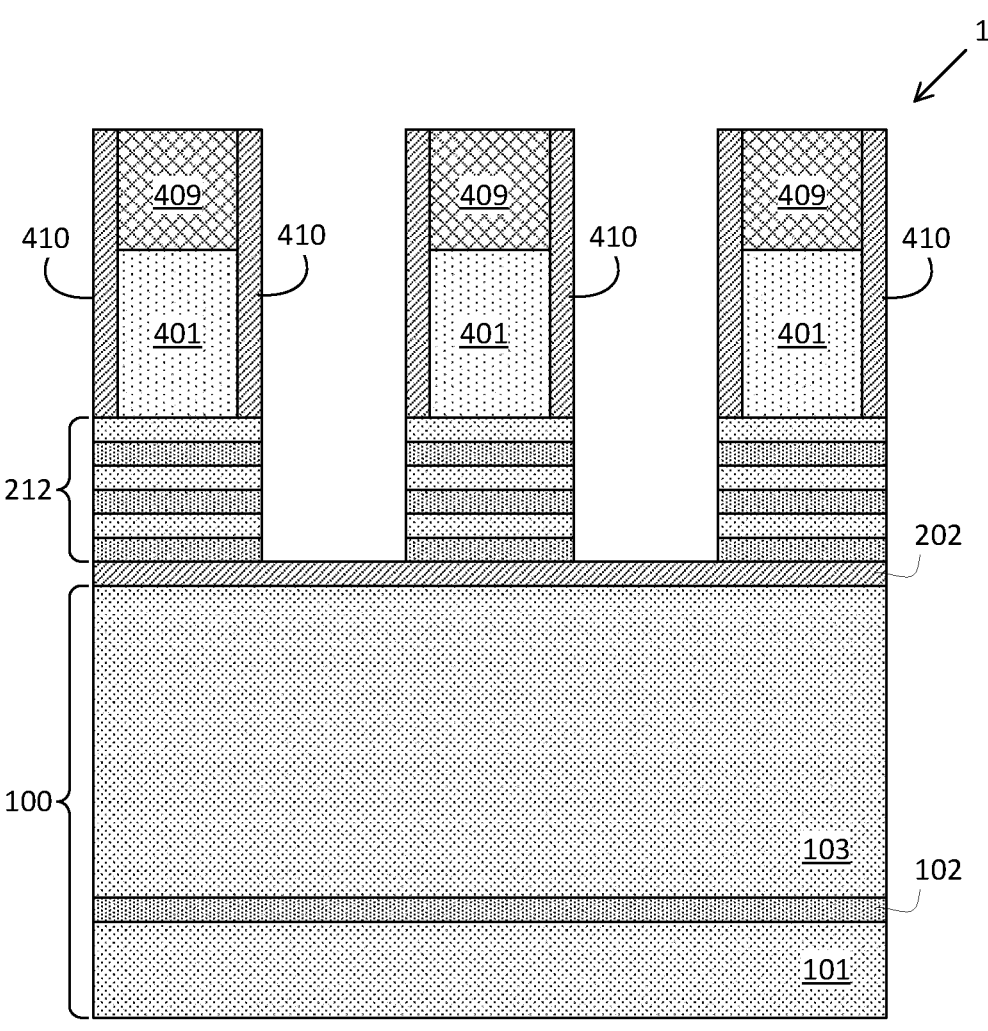

FIG. 4 is a demonstrative illustration of cross-sectional view of a semiconductor structure in a step of manufacturing thereof according to one embodiment of present invention. More particularly, following the step illustrated in FIG. 3, embodiments of present invention provide recessing or patterning the stacks of nanosheets 211 into one or more sets of nanosheets 212 in a selective etching process using, for example, the set of dummy gates 401 and the sidewall spacers 410 as masks in the selective etching process. The patterning process of the stacks of nanosheets 211 creates openings between the set of dummy gates 401 for forming sources/drain regions of the nanosheet transistors and below the openings, in the substrate 100, to form backside contacts according to embodiments of present invention.

Figure 5:
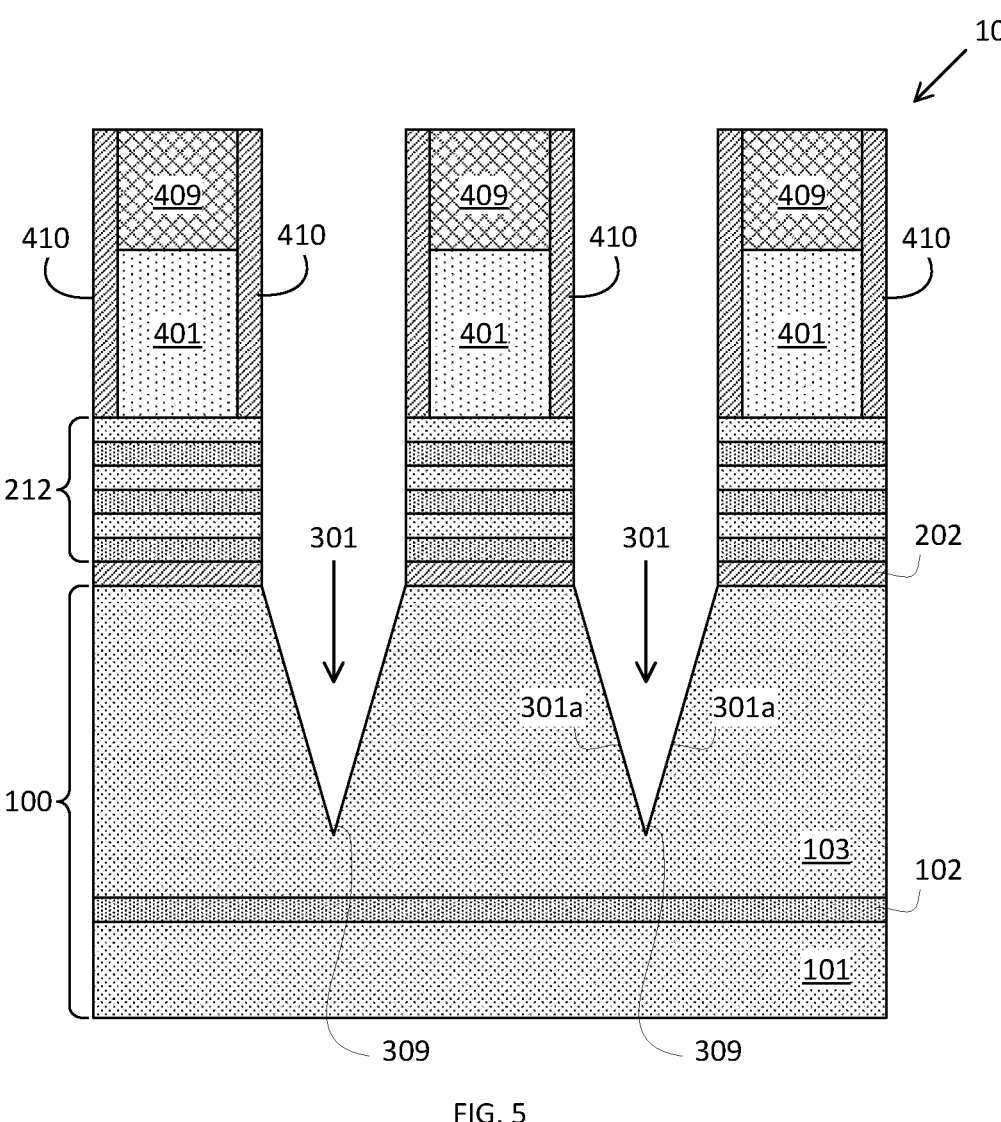

FIG. 5 is a demonstrative illustration of cross-sectional view of a semiconductor structure in a step of manufacturing thereof according to one embodiment of present invention. More particularly, following the step illustrated in FIG. 4, embodiments of present invention provide etching the substrate 100 by first punching through the dielectric layer 202 and subsequently creating one or more first recesses 301 in the Si layer 103 of the substrate 100. The one or more first recesses 301 may be etched to have a triangle shape below a top surface of the substrate 100 to have a pointy bottom 309. In one embodiment, the one or more first recesses 301 may be created in a plasma dry etch process. The plasma dry etch process may create two facets 301*a*, in the Si layer 103, that merge together to form the pointy bottom 309.

Figure 6:
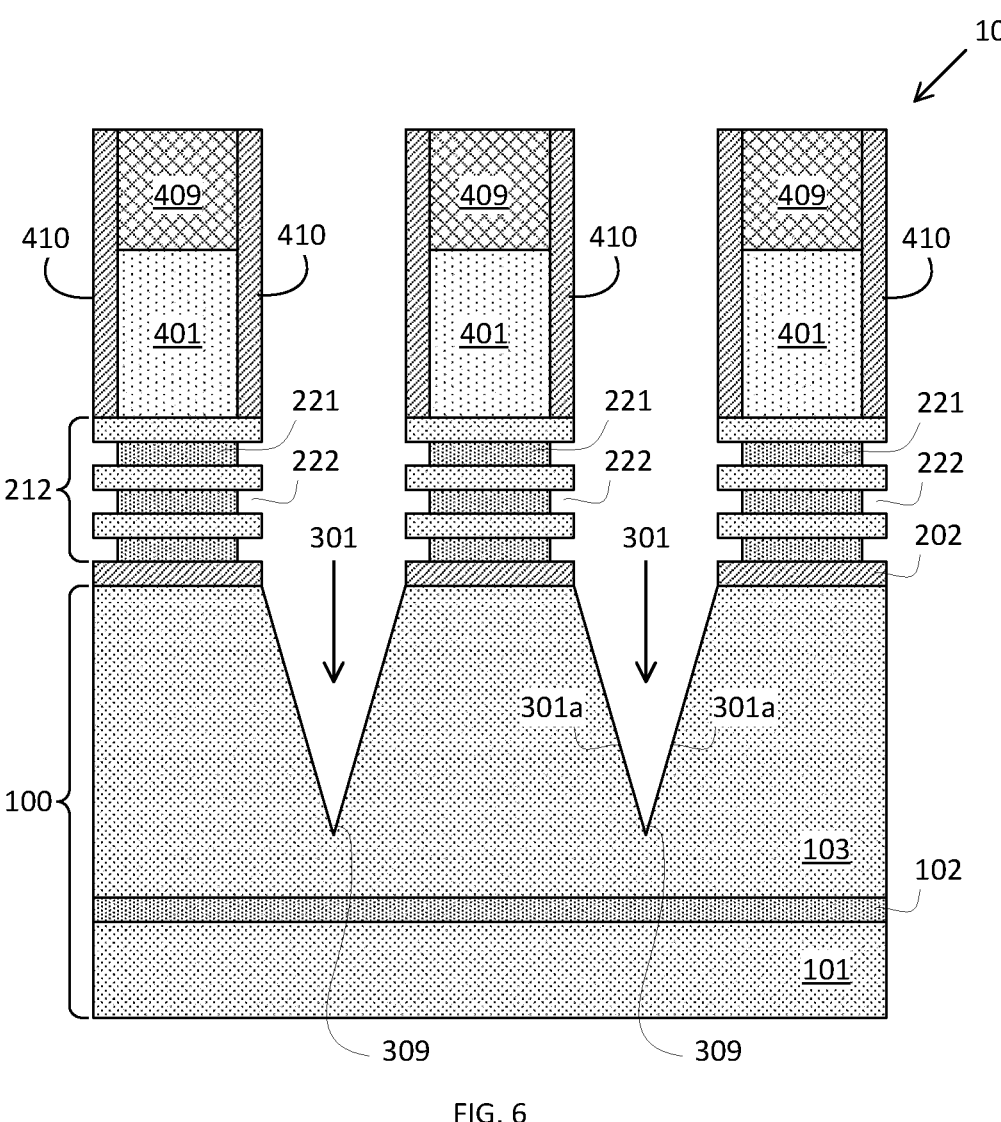

FIG. 6 is a demonstrative illustration of cross-sectional view of a semiconductor structure in a step of manufacturing thereof according to one embodiment of present invention. More particularly, following the step illustrated in FIG. 5, embodiments of present invention provide performing indentation of the SiGe30 layers 221 that separate the set of Si nanosheets of the one or more sets of nanosheets 212. The indentation may create a plurality of indents 222 at the two ends of the SiGe30 layers 221, wherein inner spacers may be formed to separate channel regions from source/drain regions of the nanosheet transistors.

Figure 7:
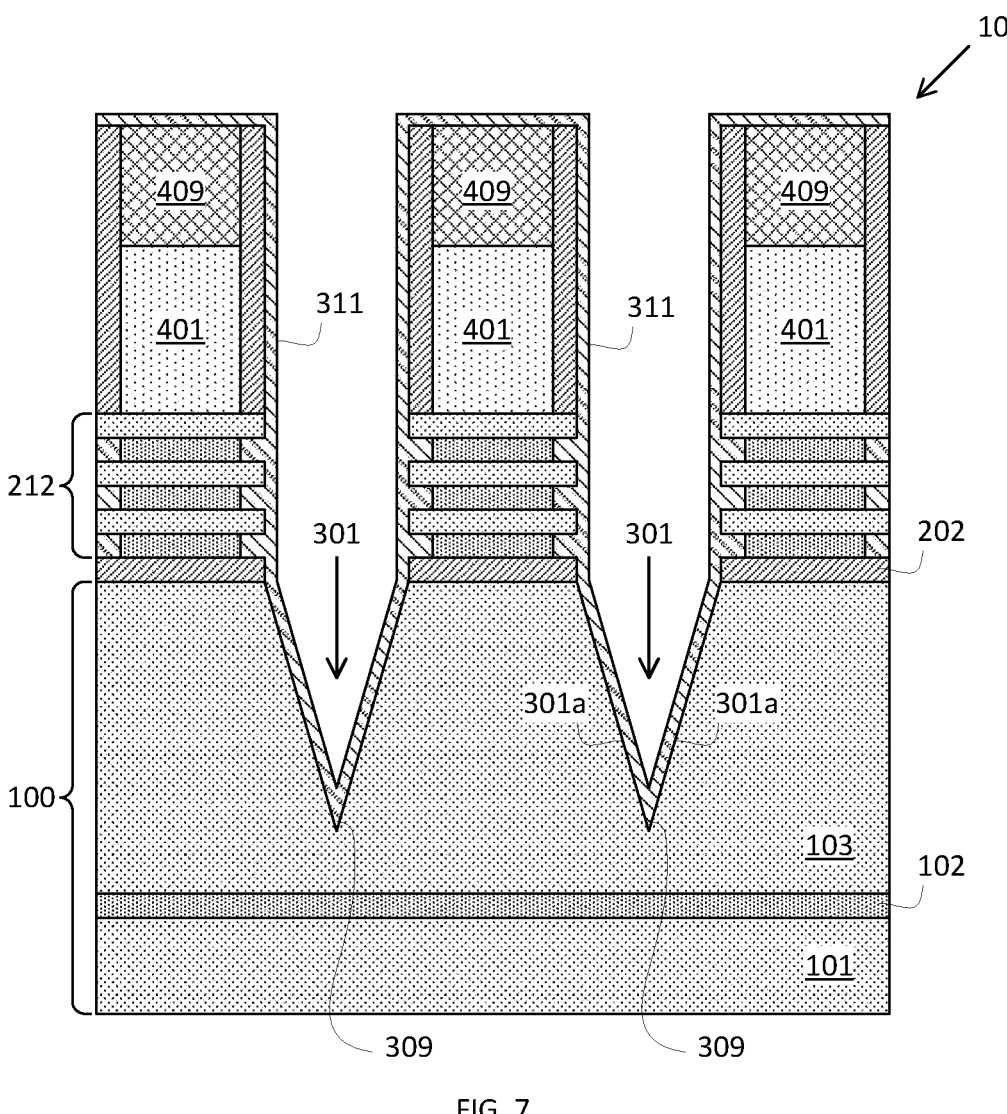

FIG. 7 is a demonstrative illustration of cross-sectional view of a semiconductor structure in a step of manufacturing thereof according to one embodiment of present invention. More particularly, following the step illustrated in FIG. 6, embodiments of present invention provide depositing a conformal liner 311 lining the one or more first recesses 301, the one or more sets of nanosheets 212, and the set of dummy gates 401. The conformal liner 311 may include or be made of dielectric materials such as, for example, SiN, SiBCN, SiOCN, SiOC, etc. and may pinch off to fill the plurality of indents 222. More particularly, a portion of the conformal liner 311 may pinch off at the pointy bottom 309 of the recesses 301 to form a small region that is filled with the dielectric material. The small region of dielectric material may then be formed into or become a dielectric anchor as being described below in more details.

Figure 8:
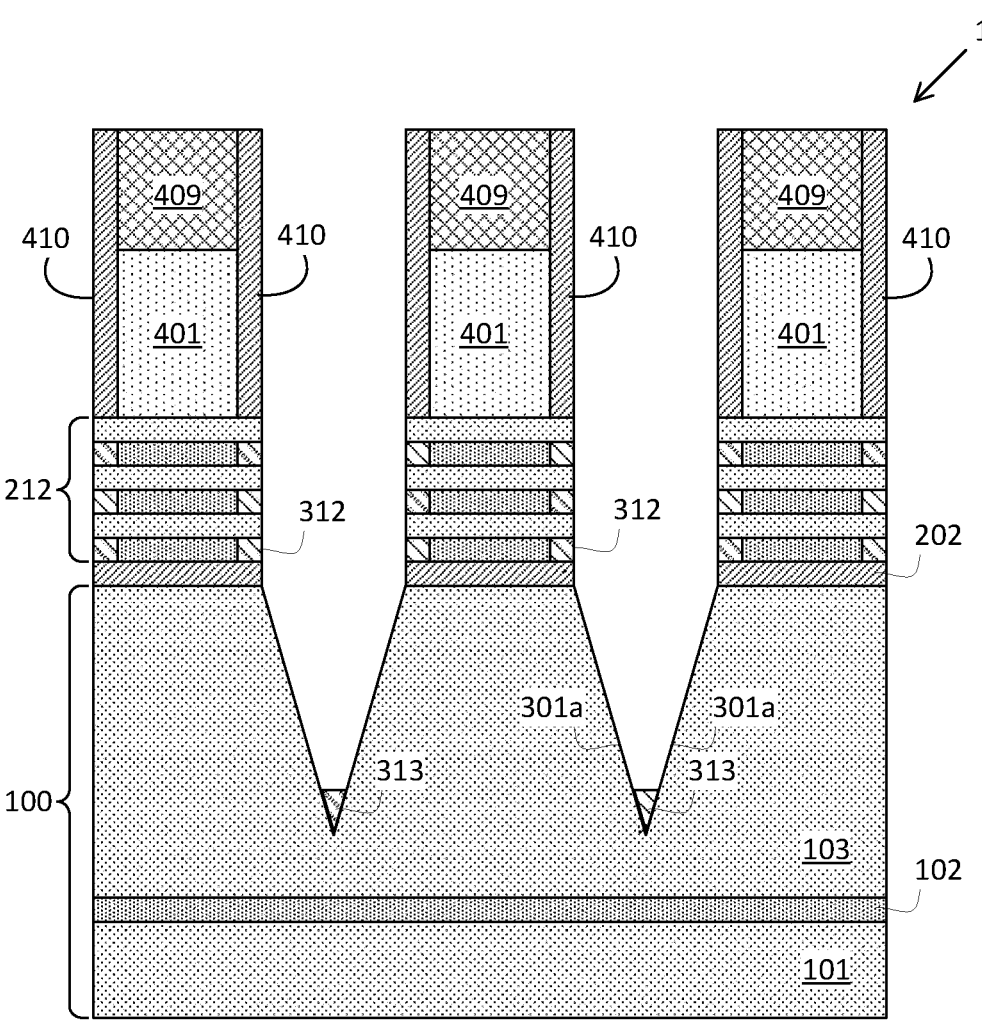

FIG. 8 is a demonstrative illustration of cross-sectional view of a semiconductor structure in a step of manufacturing thereof according to one embodiment of present invention. More particularly, following the step illustrated in FIG. 7, embodiments of present invention provide performing an isotropic etch-back of the conformal liner 311. The isotropic etch-back process may remove a majority part of the conformal liner 311 at the sidewalls of the set of dummy gates 401 to leave portions of the conformal liner 311 in the plurality of indents 222 to form inner spacers 312. More importantly, inside the one or more first recesses 301, the isotropic etch-back process may leave portions of the conformal liner 311, that is the pinched off portions of the conformal liner 311, substantially unetched at the pointy bottom 309 while remove rest of the conformal liner 311 to expose the facets 301*a*. The pinched off portions of the conformal liner 311 that remain inside the one or more first recesses 301 become one or more dielectric anchors 313. As is clear from the above, the dielectric anchor 313 may be made of, for example, SiN, SiBCN, SiOCN, SiOC or other suitable dielectric materials. More particularly, the dielectric anchor 313 may enable a subsequent sigma etch process to create one or more second recesses, during which the dielectric anchor 313 may remain substantially unetched. Moreover, the dielectric anchor 313 may cause slow down of the sigma etch in areas near the dielectric anchor 313, thereby causing the creation of a first and a second set of facets of the one or more second recesses. As is described below in more details, when being measured vertically, the first set of facets may have a first height and the second set of facets may have a second height and the first height may be greater than the second height.

Figure 9:
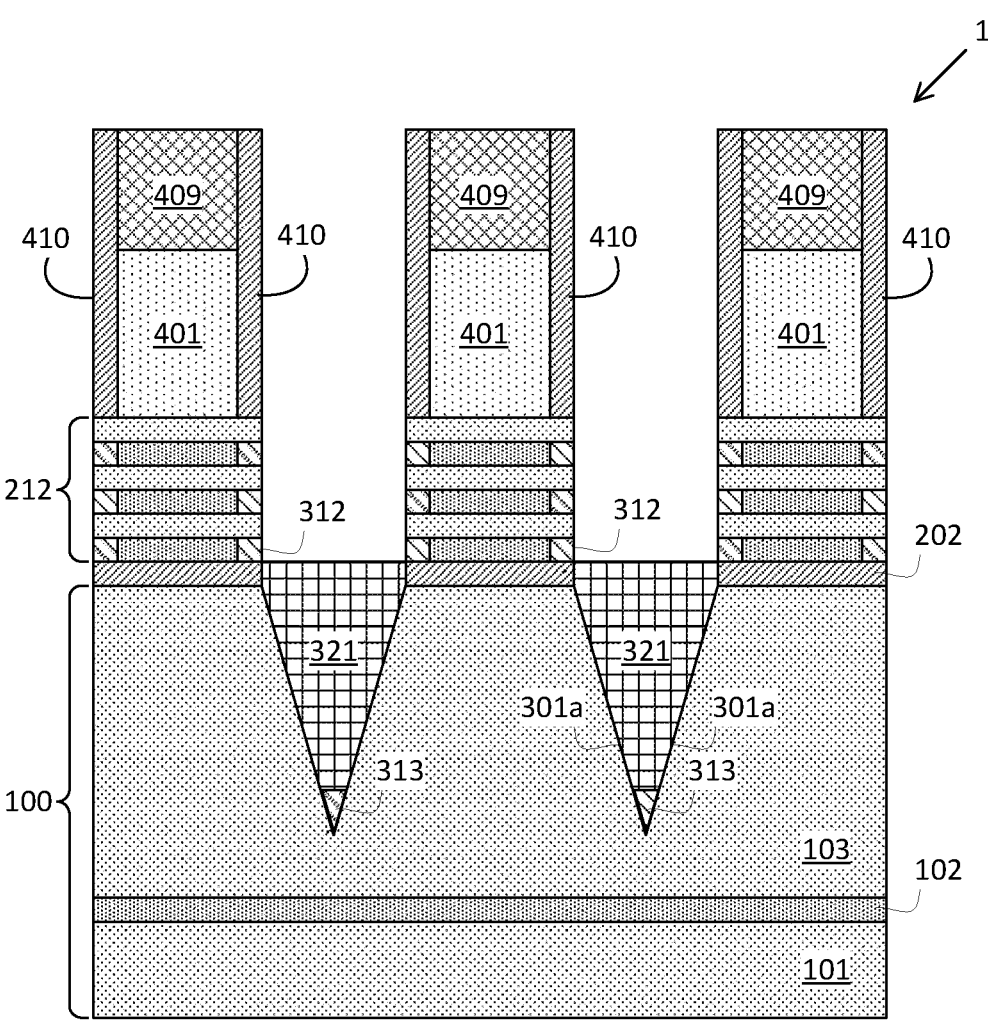

FIG. 9 is a demonstrative illustration of cross-sectional view of a semiconductor structure in a step of manufacturing thereof according to one embodiment of present invention. More particularly, following the step illustrated in FIG. 8, embodiments of present invention provide filling the one or more first recesses 301, above the dielectric anchor 313 in the pointy bottom 309, to form an organic planarization layer (OPL) 321. For example, spaces between the set of dummy gates 401 may first be filled with an organic planarization material. The organic planarization material may then be recessed to a level below the one or more sets of nanosheets 212 but above a top surface of the Si layer 103. For example, the organic planarization material may be recessed to a level around the dielectric layer 202. The OPL 321 formed thereby covers the sidewalls of the one or more first recesses 301 but have sidewalls of the one or more sets of nanosheets 212 as well as the set of dummy gates 401 exposed. Protective material may then be formed to cover the structure of nanosheet transistors above the substrate 100, before embodiments of present invention proceed to further process the substrate 100 to form placeholders.

Figure 10:
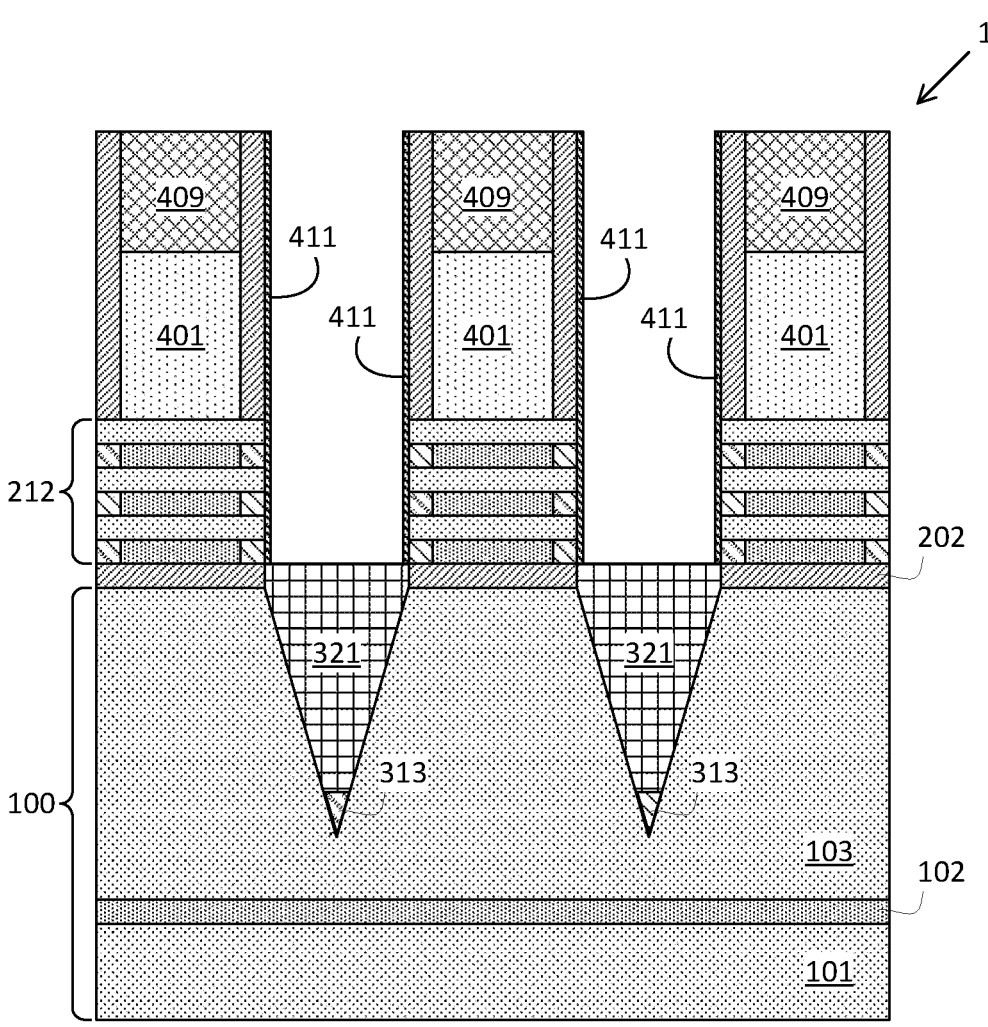

FIG. 10 is a demonstrative illustration of cross-sectional view of a semiconductor structure in a step of manufacturing thereof according to one embodiment of present invention. More particularly, following the step illustrated in FIG. 9, embodiments of present invention provide forming a plurality of protective spacers 411 at sidewalls of the one or more sets of nanosheets 212 as well as at sidewall spacers 410 of the set of dummy gates 401. The protective spacers 411 protect the nanosheet transistor structures from being processed during subsequent steps of creating second recesses in the substrate 100.

Figure 11:
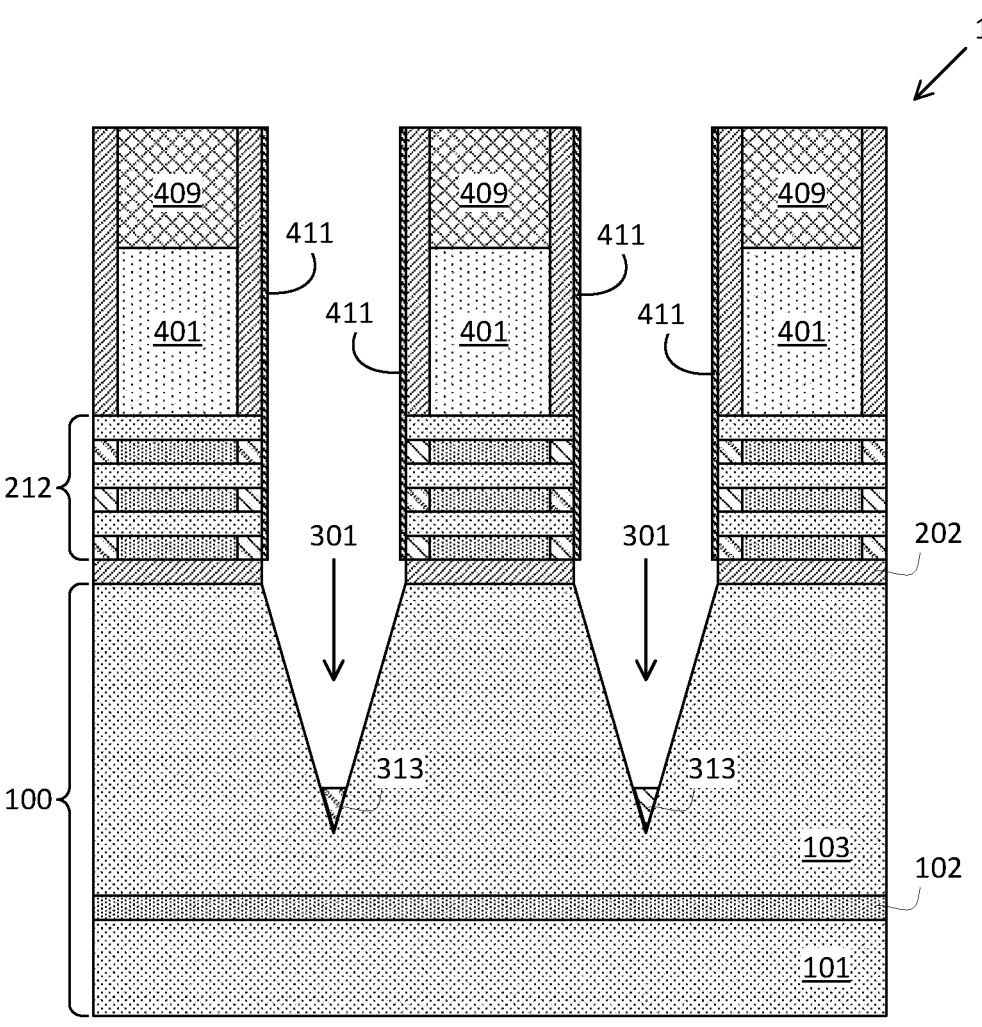

FIG. 11 is a demonstrative illustration of cross-sectional view of a semiconductor structure in a step of manufacturing thereof according to one embodiment of present invention. More particularly, following the step illustrated in FIG. 10, embodiments of present invention provide selectively removing the OPL 321 to expose the sidewalls of the first recesses 301 while the protective spacers 411 remain substantially intact and protect the nanosheet transistor structures above the substrate 100.

Figure 12:
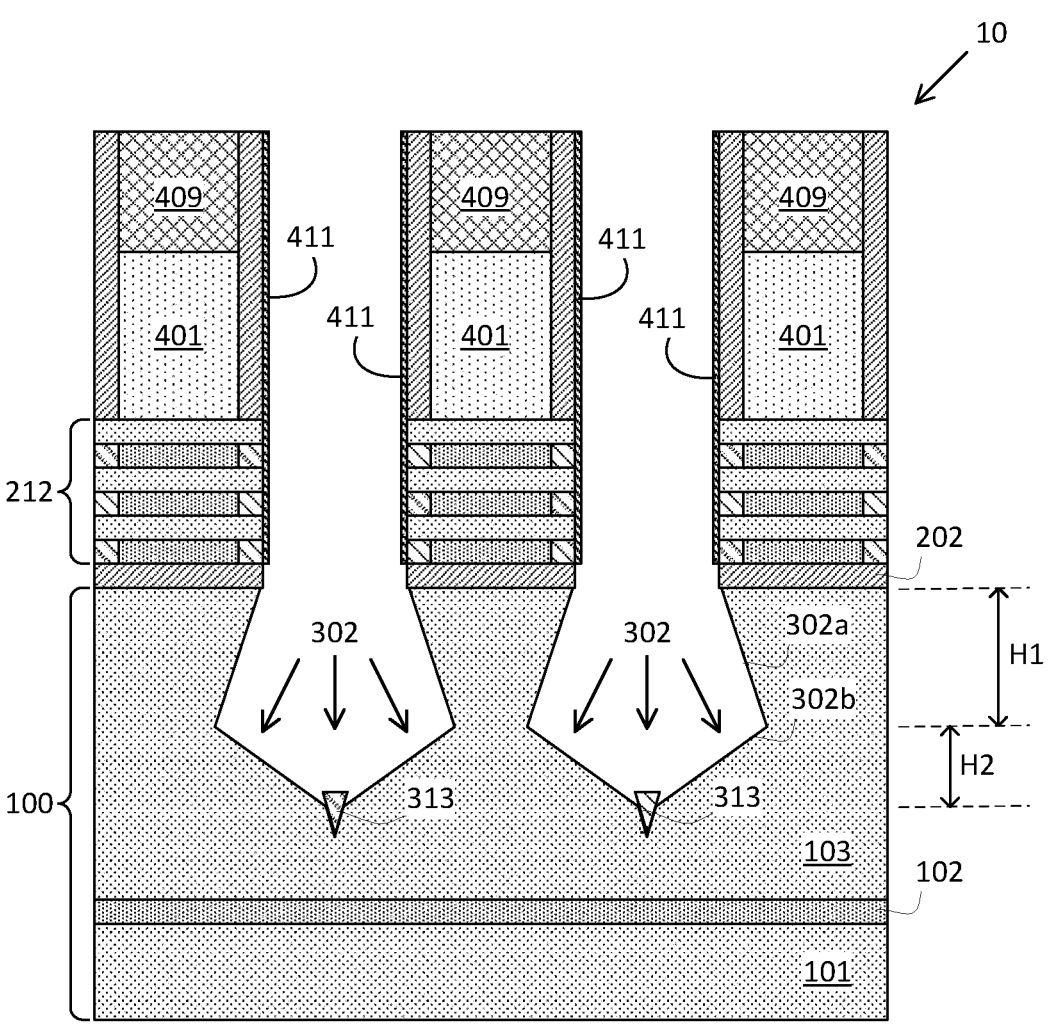

FIG. 12 is a demonstrative illustration of cross-sectional view of a semiconductor structure in a step of manufacturing thereof according to one embodiment of present invention. More particularly, following the step illustrated in FIG. 11, embodiments of present invention provide performing a sigma etch, through the first recesses 301, to create one or more second recesses 302. According to one embodiment of present invention, the presence of the dielectric anchors 313 at the pointy bottoms 309 of the one or more first recesses 301 may slow down the sigma etch in areas close to the dielectric anchors 313. Because of this slowing effect or modified etching rate, the second recesses 302 created by this sigma etch may have a first set of facets 302a adjacent or next to the top surface of the Si layer 103, and a second set of facets 302b adjacent or next to the dielectric anchors 313. In one embodiment, as is illustrated in FIG. 12, the first set of facets 302a may have a first height H1 measured vertically from one end to the other end of the facet 302a. The second set of facets 302b may have a second height H2 measured vertically from one end to the other end of the facet 302b. According to embodiments of present invention, the first height H1 may be greater than the second height H2. During the sigma etch to form the second recesses 302, the dielectric anchors 313 may remain anchored in the Si layer 103. In other words, by strategically applying etch selectivity, the sigma etch process does not remove the dielectric anchors 313, which remain at the bottom of the one or more second recesses 302.

Figure 13:
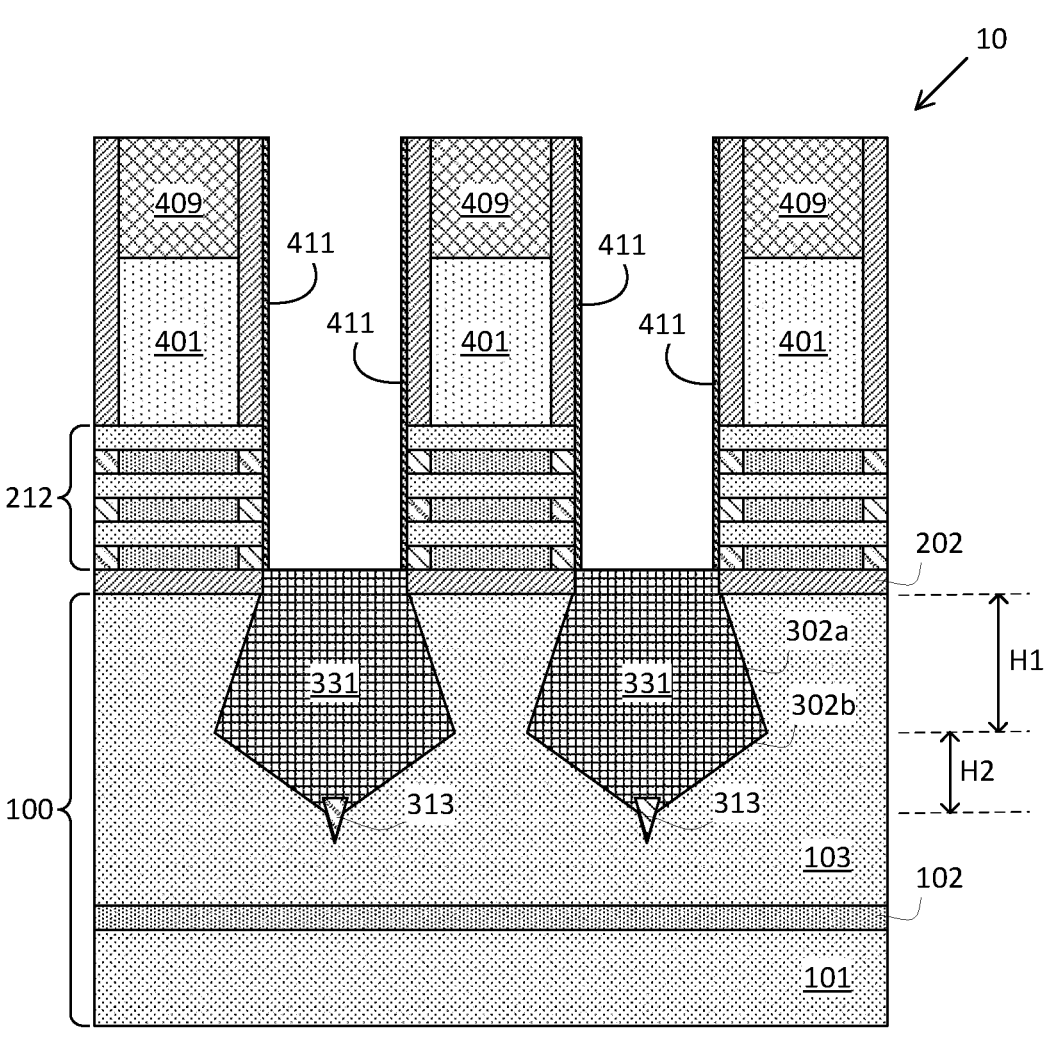

FIG. 13 is a demonstrative illustration of cross-sectional view of a semiconductor structure in a step of manufacturing thereof according to one embodiment of present invention. More particularly, following the step illustrated in FIG. 12, embodiments of present invention provide epitaxially growing placeholders 331 in the one or more second recesses 302. For example, SiGe may be epitaxially grown in the second recesses 302 formed inside the Si layer 103 and may surround a portion of the dielectric anchors 313.

Figure 14:
Figure 14:
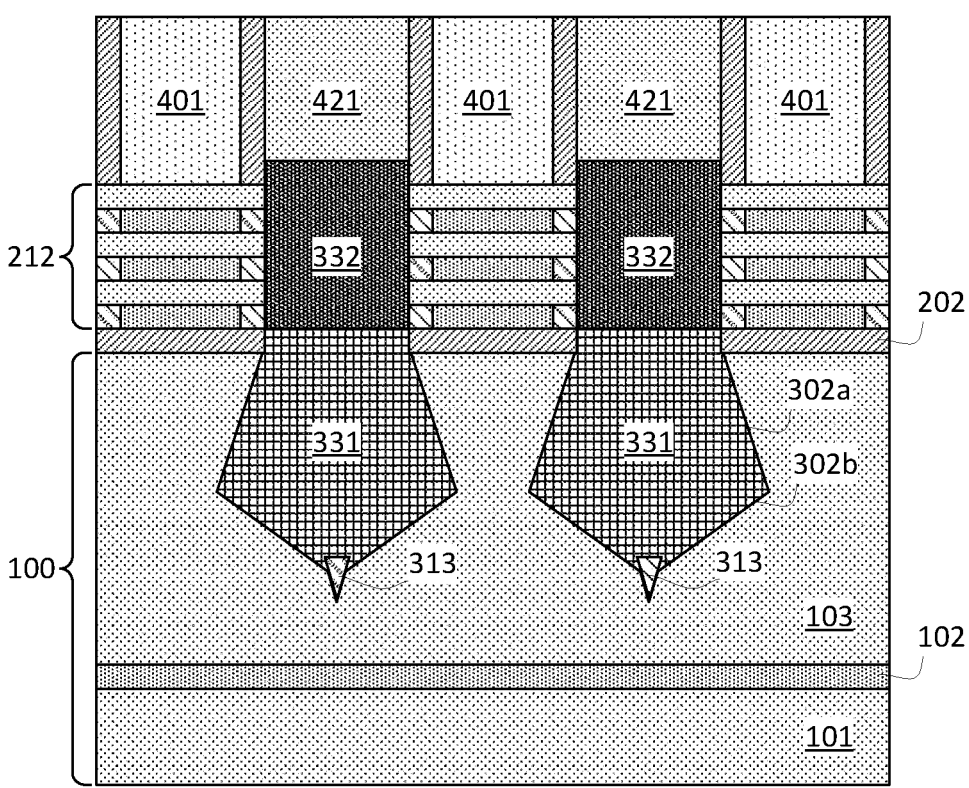

FIG. 14 is a demonstrative illustration of cross-sectional view of a semiconductor structure in a step of manufacturing thereof according to one embodiment of present invention. More particularly, following the step illustrated in FIG. 13, embodiments of present invention provide continuing forming the structure of nanosheet transistors on top of the substrate 100. In doing so, embodiments of present invention provide selectively removing the protective spacers 411 to expose the one or more sets of nanosheets 212; epitaxially growing source/drain regions 332 above the placeholders 331 and next to the Si nanosheets of the one or more sets of nanosheets 212; and depositing a dielectric layer 421 to cover the top of the source/drain regions 332. A chemical-mechanical-polishing (CMP) process may subsequently be applied to planarize a top surface of the structure, including removing the hard masks 409, until the one or more dummy gates 401 are exposed.

Figure 15:
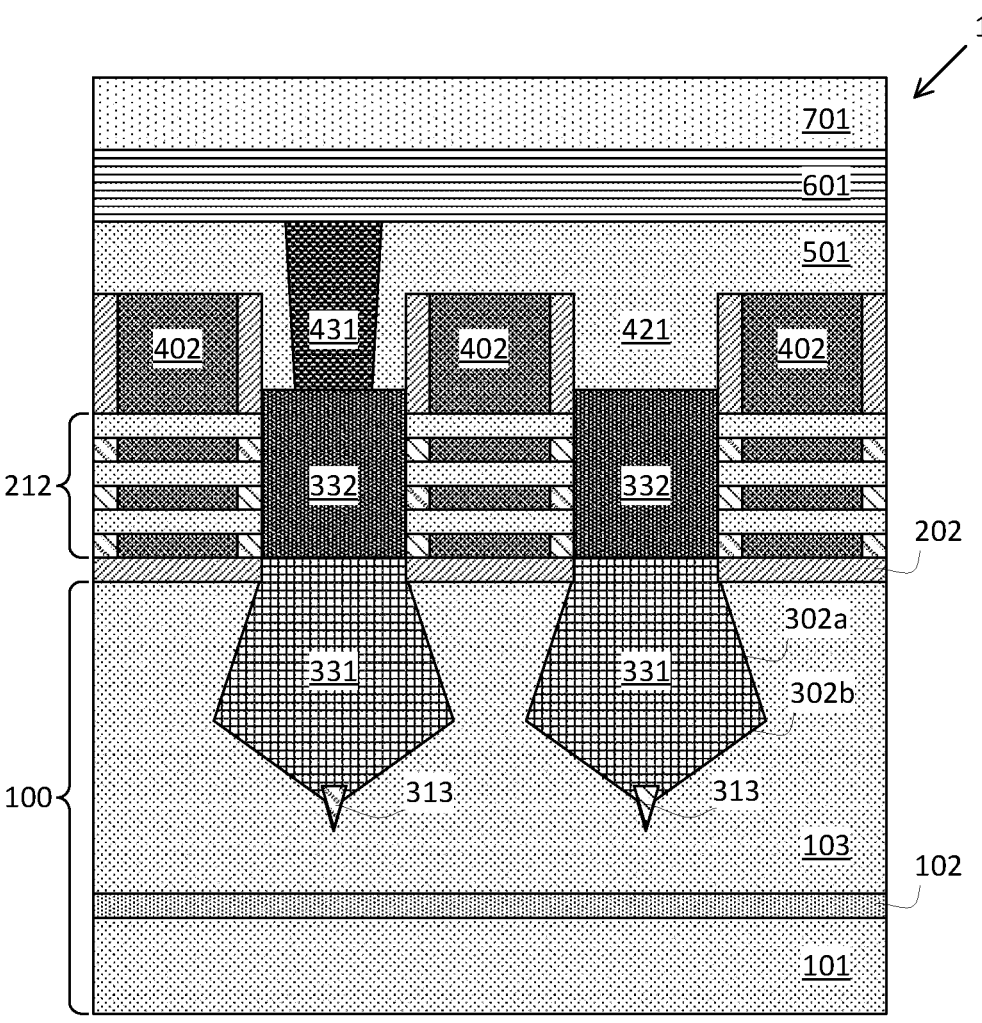

FIG. 15 is a demonstrative illustration of cross-sectional view of a semiconductor structure in a step of manufacturing thereof according to one embodiment of present invention. More particularly, following the step illustrated in FIG. 14, embodiments of present invention provide continuing forming structures of the nanosheet transistors and structures on top thereof. More particularly, embodiments of present invention provide forming one or more metal gates 402 in a replacement-metal-gate (RMG) process; depositing another dielectric layer 501 on top of the metal gates 402 and the dielectric layer 421; and forming a middle-of-line (MOL)

structure such as one or more source/drain contact, for example, a source/drain contact 431 through the dielectric layers 421. Embodiments of present invention may further include forming a back-end-of-line (BEOL) structure 601 on top of the MOL structure. The BEOL structure 601 may include frontside interconnect in contact with, for example, the source/drain contact 431. A carrier wafer 701 may then be attached or bonded to the BEOL structure 601 such that the structure 10, that is, the chip or wafer under manufacturing may be flipped upside-down for further processing from a backside of the structure 10.

Figure 16:
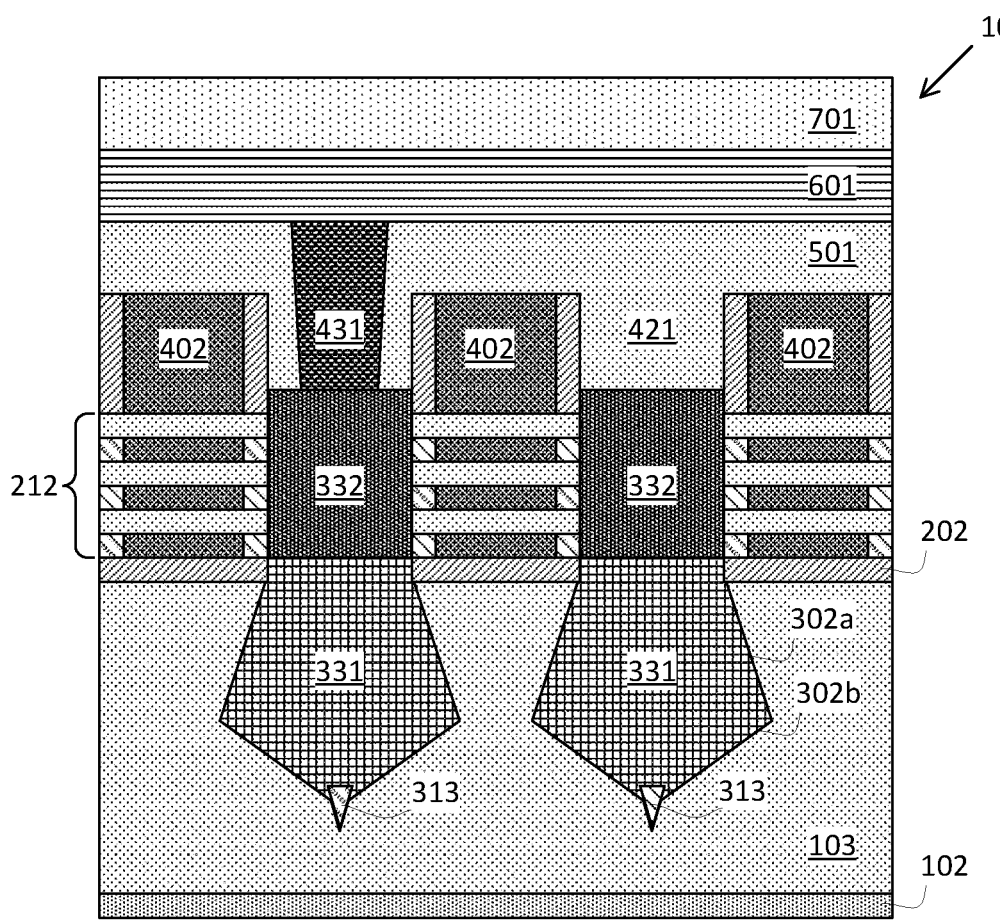

FIG. 16 is a demonstrative illustration of cross-sectional view of a semiconductor structure in a step of manufacturing thereof according to one embodiment of present invention. Here it is to be noted that, for the ease of explanation, the cross-section of the structure 10 will continue to be illustrated upside-up (instead of upside-down) although the chip or wafer is flipped and subsequent processing steps are mostly performed from the backside of the structure, that is, from the bottom side of the structure as is illustrated in FIG. 16 and subsequent drawings.

More particularly, following the step illustrated in FIG. 15, embodiments of present invention provide removing the Si substrate 101 through, for example, a CMP process, a grinding process, and/or other selective etching process. The removal of the Si substrate 101 may stop at the SiGe layer 102 which may be there for the purpose of assisting the removal of the Si substrate 101. For this reason, the SiGe layer 102 may sometimes be known as an etch-stop layer.

Figure 17:
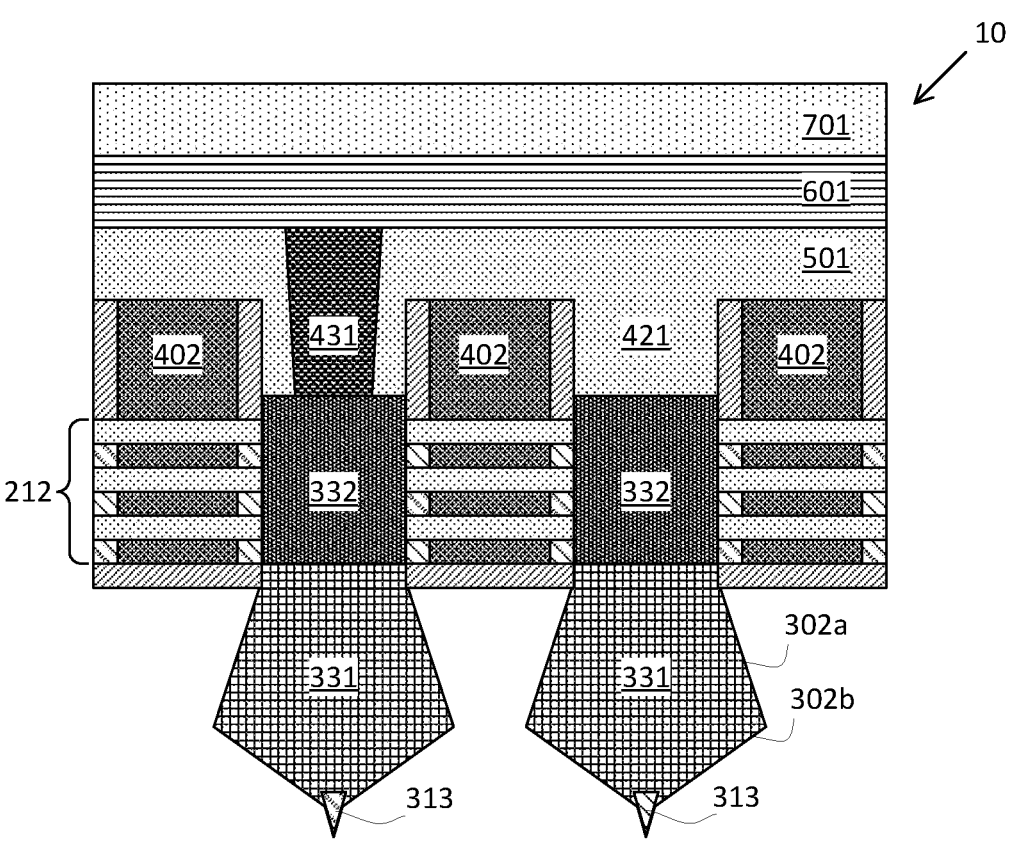

FIG. 17 is a demonstrative illustration of cross-sectional view of a semiconductor structure in a step of manufacturing thereof according to one embodiment of present invention. More particularly, following the step illustrated in FIG. 16, embodiments of present invention provide removing the SiGe layer 102 and the Si layer 103 that surrounds the placeholders 331 and the dielectric anchors 313. The Si layer 103 may be selectively removed by strategically applying etch selectivity of the placeholders 331, which are made of SiGe, and the dielectric anchors 313, both of which are different from the Si material of the Si layer 103.

Figure 18:
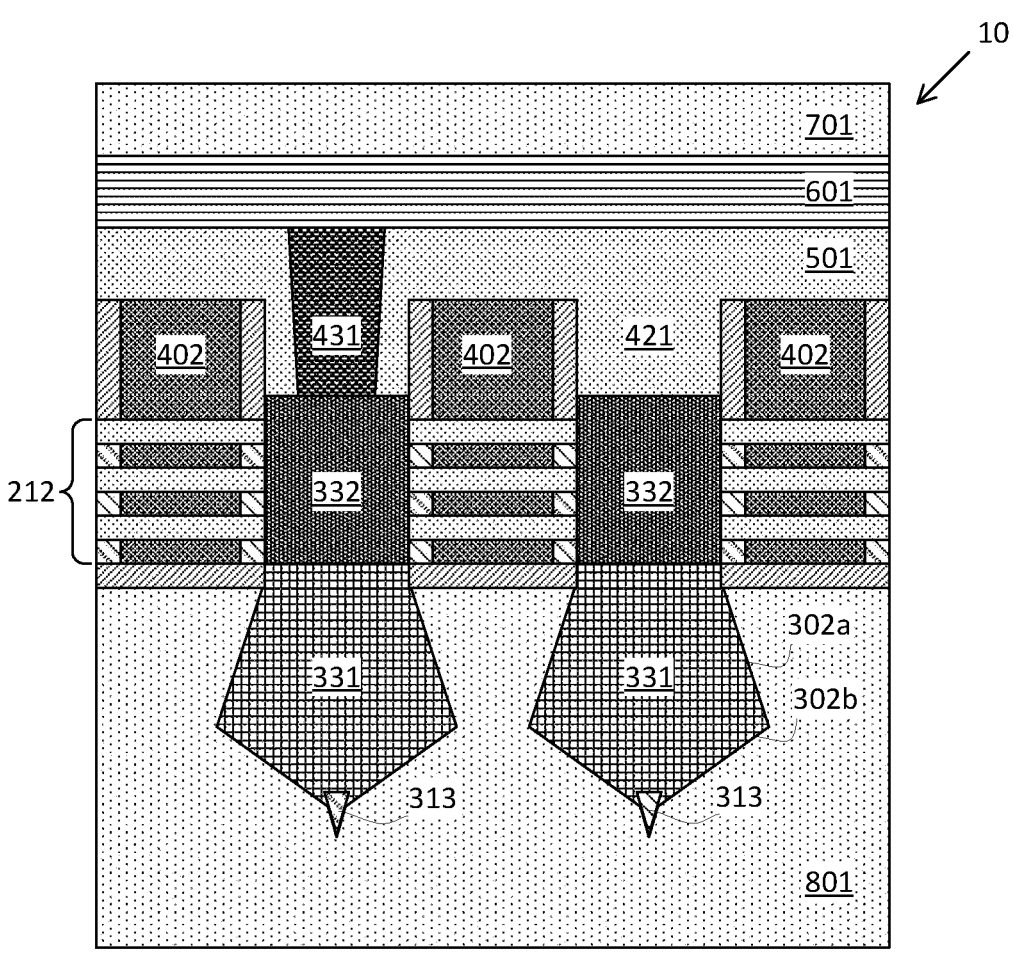

FIG. 18 is a demonstrative illustration of cross-sectional view of a semiconductor structure in a step of manufacturing thereof according to one embodiment of present invention. More particularly, following the step illustrated in FIG. 17, embodiments of present invention provide depositing a dielectric layer 801 such as, for example, a silicon-oxide $(SiO_2)$ on top of and surrounding the one or more placeholders 331 and the one or more dielectric anchors 313 on top of the one or more placeholders 331 since the structure 10 is flipped upside-down.

Figure 19:
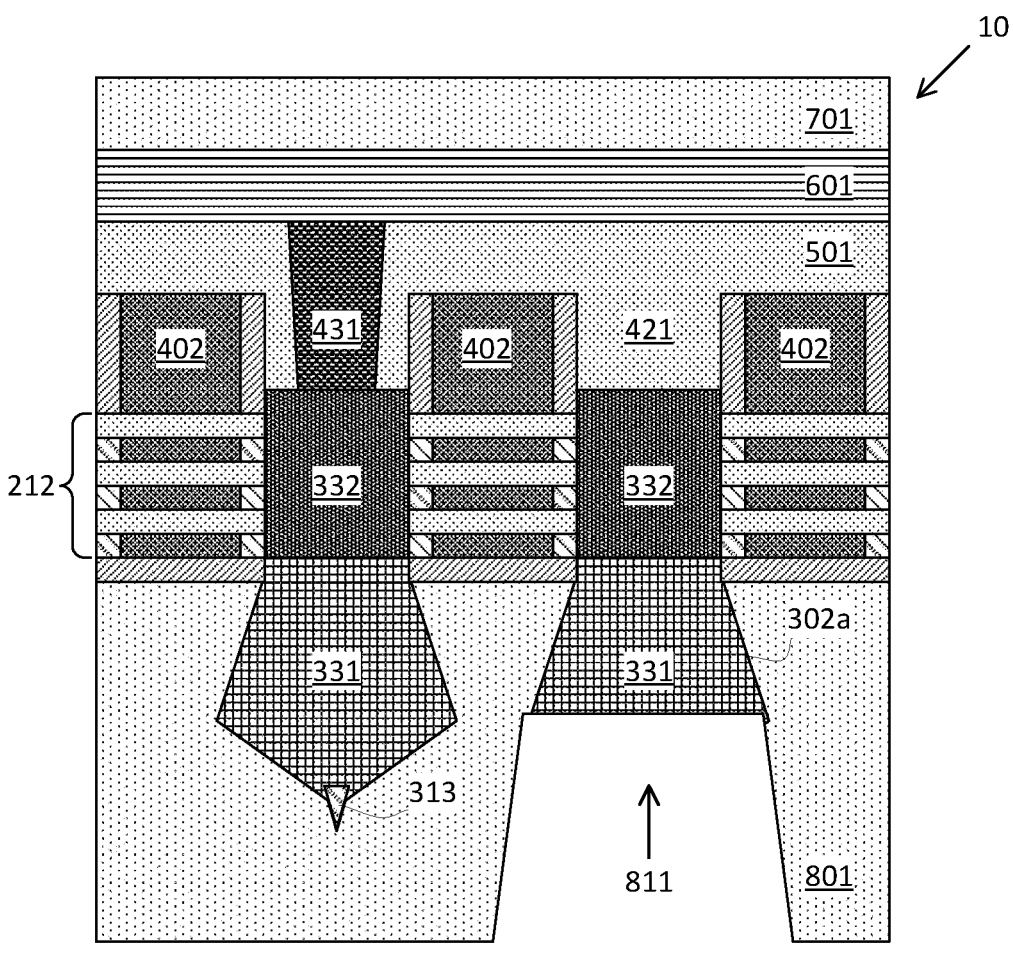

FIG. 19 is a demonstrative illustration of cross-sectional view of a semiconductor structure in a step of manufacturing thereof according to one embodiment of present invention. More particularly, following the step illustrated in FIG. 18, embodiments of present invention provide creating one or more openings such as, for example, an opening 811 in the dielectric layer 801. Creation of the opening 811 may also remove a portion of the placeholder 331. The remaining portion of the placeholder 331 may be a portion surrounded by the first set of facets 302a, thus having a trapezoidal shape. The trapezoidal shape may have a top base and a bottom base with the top base having a width that is substantially the same as the width of the source/drain region 332 while the bottom base being larger than the top base. The larger bottom base helps the formation of backside contact as being described below in more details.

Figure 20:
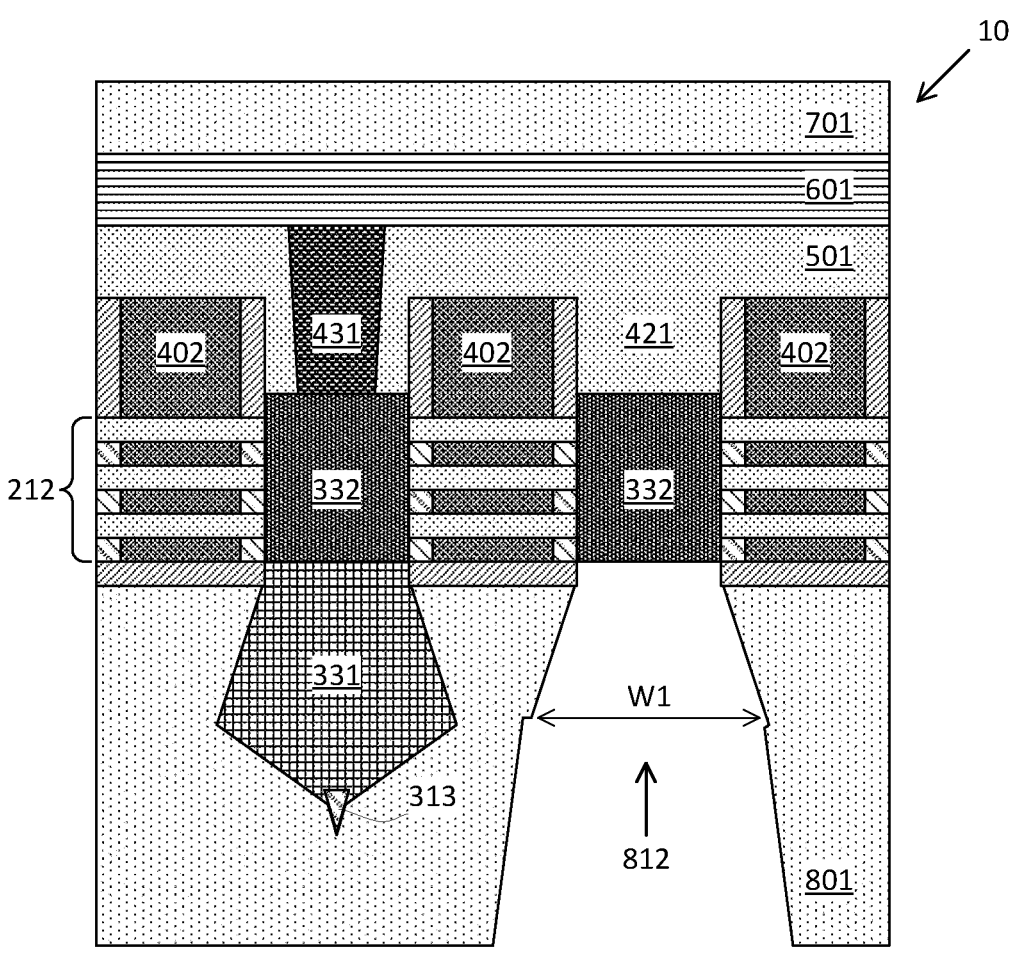

FIG. 20 is a demonstrative illustration of cross-sectional view of a semiconductor structure in a step of manufacturing thereof according to one embodiment of present invention. More particularly, following the step illustrated in FIG. 19, embodiments of present invention provide selectively removing the remaining portion of placeholder 331 to expose a bottom surface of the source/drain region 332. As is illustrated in FIG. 20, the removal of the remaining portion of placeholder 331 creates an opening 812, and the larger bottom base of the remaining portion of placeholder 331 helps create a bigger entry point with a width W1, that in-turn helps a metal deposition process to form the backside contact.

Figure 21:
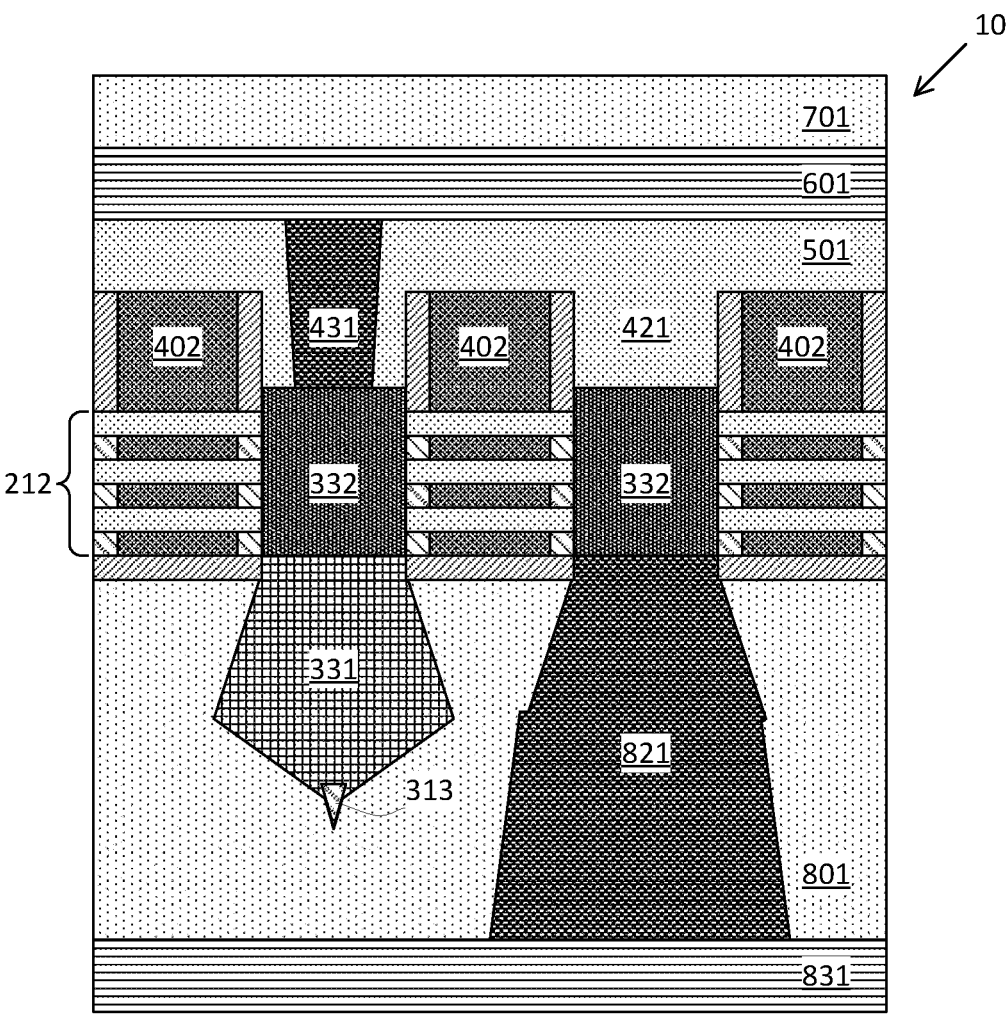

FIG. 21 is a demonstrative illustration of cross-sectional view of a semiconductor structure in a step of manufacturing thereof according to one embodiment of present invention. More particularly, following the step illustrated in FIG. 20, embodiments of present invention provide depositing a conductive material in the opening 812 to form a backside contact 821 inside the dielectric layer 801. With the widened opening derived from the placeholder 331, filling the conductive material in the opening 812 may become easier without fear of, for example, creating any void in the formed backside contact 821.

Following the formation of the backside contact 821, a backside interconnect structure 831 may be formed on top of the dielectric layer 801 and the backside contact to provide contacts to the nanosheet transistors.

FIG. 22 is a demonstrative illustration of a flow-chart of a method of manufacturing a semiconductor structure according to embodiments of present invention. The method includes (901) forming a set of gate stacks on top of a substrate, where the substrate includes a silicon layer; (902) forming a first recess in the silicon layer, where the first recess has a pointy bottom; (903) depositing a conformal liner lining the first recess, where the conformal liner pinches off at the pointy bottom of the first recess; (904) performing an isotropic etch-back of the conformal liner, the isotropic etch-back leaves a portion of the conformal liner at the pointy bottom to form a dielectric anchor in the silicon layer; (905) performing a sigma etch of the silicon layer through the first recess to form a second recess, where the dielectric anchor slows the sigma etch in areas near the dielectric anchor; (906) form a placeholder in the second recess, the placeholder having an upper portion and a lower portion, the upper portion having a trapezoidal shape with a top base smaller than a bottom base; (907) from backside of the substrate, removing the substrate including the silicon layer and form a dielectric layer on top of the placeholder; and (908) creating an opening in the dielectric layer to expose the placeholder, removing the placeholder, and forming a backside contact in the opening.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A method comprising:

creating a first recess in a substrate, the first recess having a pointy bottom;

forming a dielectric anchor at the pointy bottom of the first recess;

performing a sigma etch of the substrate via the first recess while keeping the dielectric anchor at the pointy bottom of the first recess, thereby transforming the first recess into a second recess; and filling the second recess with a semiconductor material to form a placeholder.

2. The method of claim 1, wherein forming the dielectric anchor comprises:

depositing a conformal liner lining the first recess, wherein a portion of the conformal liner pinches off at the pointy bottom of the first recess; and performing an isotropic etch-back of the conformal liner, wherein the isotropic etch-back leaves the portion of the conformal liner that pinches off at the pointy bottom of the first recess substantially unetched to form the dielectric anchor while removing portions of the conformal liner above the dielectric anchor from the first recess.

3. The method of claim 1, wherein the second recess has a first set of facets adjacent to a top surface of the substrate and a second set of facets adjacent to the dielectric anchor, wherein the first and the second set of facets, when being measured vertically, have a first height and a second height respectively, and the first height of the first set of facets is greater than the second height of the second set of facets.

4. The method of claim 3, wherein the dielectric anchor at the pointy bottom of the first recess causes the sigma etch to slow down in areas near the dielectric anchor thereby causing the second recess to have the first and the second set of facets.

5. The method of claim 1, wherein the first recess has a triangle shape with the pointy bottom.

6. The method of claim 1, wherein performing the sigma etch does not cause the dielectric anchor to be removed from the first recess, and causes the dielectric anchor to remain at a bottom of the second recess.

7. The method of claim 1, wherein the placeholder comprises silicon-germanium (SiGe), further comprising replacing the placeholder with a conductive material to form a backside contact.

8. The method of claim 7, before replacing the placeholder, further comprising replacing the substrate with a dielectric layer and causing the placeholder to be embedded in the dielectric layer.

9. The method of claim 1, wherein the first recess is formed horizontally between a first gate stack and a second gate stack and in the substrate, wherein the first and the second gate stack are formed on top of the substrate.

10. A method of forming backside contact comprising:
    forming a set of gate stacks on top of a substrate;
    creating a first recess in the substrate between the set of gate stacks, the first recess having a triangle shape with a pointy bottom;
    forming a dielectric anchor at the pointy bottom of the first recess;

with the dielectric anchor at the pointy bottom of the first recess, performing a sigma etch of the substrate through the first recess to form a second recess;
epitaxially growing a semiconductor material in the second recess to form a placeholder for a backside contact;
surrounding the placeholder with a dielectric material; and
replacing the placeholder with a conductive material to form the backside contact.

11. The method of claim 10, wherein forming the dielectric anchor comprises:
    depositing a conformal liner lining the first recess, a portion of the conformal liner pinching off at the pointy bottom of the first recess; and
    performing an isotropic etch-back of the conformal liner, the isotropic etch-back leaving the portion of the conformal liner at the pointy bottom substantially unetched to form the dielectric anchor while removing rest of the conformal liner from the first recess.

12. The method of claim 10, wherein the second recess has a first set of facets adjacent to a top surface of the substrate and a second set of facets adjacent to the dielectric anchor, and wherein, when being measured vertically, the first and the second set of facets have a first height and a second height respectively, and the first height of the first set of facets is greater than the second height of the second set of facets.

13. The method of claim 12, wherein the dielectric anchor causes the sigma etch to slow down in areas near the dielectric anchor thereby forming the first and the second set of facets.

14. The method of claim 10, wherein the first recess has a triangle shape below a top surface of the substrate, the triangle shape includes the pointy bottom.

* * * * *